United States Patent
Krassnitzer et al.

(10) Patent No.: US 9,165,749 B2
(45) Date of Patent: Oct. 20, 2015

(54) ARC SOURCE AND MAGNET CONFIGURATION

(75) Inventors: Siegfried Krassnitzer, Feldkirch (AT); Jürg Hagmann, Sax (CH); Juergen Gwehenberger, Dafins (AT)

(73) Assignee: OERLIKON TRADING AG, TRUEBBACH, Truebbach (CH)

( * ) Notice: Subject to any disclaimer, the term of this patent is extended or adjusted under 35 U.S.C. 154(b) by 1520 days.

(21) Appl. No.: 11/747,999

(22) Filed: May 14, 2007

(65) Prior Publication Data

US 2008/0110749 A1 May 15, 2008

(30) Foreign Application Priority Data

May 16, 2006 (CH) ........................................ 792/06

(51) Int. Cl.
*C23C 14/56* (2006.01)
*C23C 14/32* (2006.01)
*H01J 37/32* (2006.01)
*H01J 37/34* (2006.01)

(52) U.S. Cl.
CPC ........... *H01J 37/3266* (2013.01); *C23C 14/325* (2013.01); *H01J 37/32055* (2013.01); *H01J 37/32614* (2013.01); *H01J 37/345* (2013.01); *H01J 37/3452* (2013.01); *H01J 37/3458* (2013.01); *C23C 14/564* (2013.01)

(58) Field of Classification Search
CPC ................. C23C 14/325; C23C 14/564; H01J 37/32055; H01J 37/32614; H01J 37/3266; H01J 37/32669; H01J 37/345; H01J 37/3452; H01J 37/3458

USPC .............. 204/192.12, 192.38, 298.2, 298.41; 427/540, 580
See application file for complete search history.

(56) References Cited

U.S. PATENT DOCUMENTS

| | | |
|---|---|---|
| 3,689,740 A | 9/1972 | De Corso et al. |
| 4,265,729 A | 5/1981 | Morrison, Jr. |
| 4,444,635 A | 4/1984 | Kobayashi |
| 4,448,653 A | 5/1984 | Wegmann |

(Continued)

FOREIGN PATENT DOCUMENTS

| | | |
|---|---|---|
| DE | 4329155 | 3/1995 |
| DE | 10250941 | 5/2003 |

(Continued)

*Primary Examiner* — Michael Band
(74) *Attorney, Agent, or Firm* — Notaro, Michalos & Zaccaria P.C.

(57) ABSTRACT

The invention relates to an arc source with a target (1) having a target front face (2) for the vacuum vaporization of the target material, a target backside with a cooling plate (4), a central target region (Z) as well as a target margin. The arc source further comprises a magnet configuration (8, 9) with an inner magnet system (8) and/or an outer magnet system (9) for the generation of a magnetic field in the proximity of the target front face. At least one of the magnet systems (8) is herein radially poled and effects alone or in connection with the particular other magnet system that the field lines of the magnetic field extend here substantially parallel to the target front face (2).

10 Claims, 16 Drawing Sheets

(56) References Cited

U.S. PATENT DOCUMENTS

| | | | |
|---|---|---|---|
| 4,673,477 A | 6/1987 | Ramalingam et al. | |
| 4,724,058 A * | 2/1988 | Morrison, Jr. | 204/192.38 |
| 4,892,633 A * | 1/1990 | Welty | 204/192.12 |
| 5,262,028 A | 11/1993 | Manley | |
| 5,298,136 A | 3/1994 | Ramalingam | |
| 5,922,176 A | 7/1999 | Caskey | |
| 6,036,828 A * | 3/2000 | Beers et al. | 204/298.41 |
| 6,350,356 B1 * | 2/2002 | Welty | 204/298.12 |
| 6,869,509 B2 | 3/2005 | Gstoehl | |
| 2003/0129104 A1 | 7/2003 | Maass | |

FOREIGN PATENT DOCUMENTS

| | | |
|---|---|---|
| EP | 0899773 | 3/1999 |
| EP | 899773 A2 * | 3/1999 |
| GB | 2331768 | 6/1999 |
| WO | WO 0016373 | 3/2000 |
| WO | 02101785 | 12/2002 |
| WO | WO 2004057642 A2 * | 7/2004 |

* cited by examiner

ARC SOURCE AND MAGNET CONFIGURATION

FIELD OF TECHNOLOGY

The invention relates to an arc source according to the preamble of claim 1 as well as a magnet configuration. Preferred embodiments of the invention are disclosed herein.

PRIOR ART

The spark vaporizer method, in principle, also functions without magnetic field. The electric spark, also referred to as arc or, on the substrate, arc spot, therein moves in a random pattern (random arc) over the target. The target utilization is herein already satisfactory for some target materials, in particular for those comprised of only one component, such as for example titanium. However, when operating in the random method without guidance through an external magnetic field, the arc spot movement is very slow and the emission of macroparticles, so-called droplets, is not acceptable for most coatings with respect to the number as well as also with respect to the size.

To solve this problem, highly different methods have been proposed. Thus, it was found that with an increasing magnetic field extending parallel to the front face the droplet density decreases, while with field lines oriented perpendicularly to the target front face larger macroparticles tend to be emitted. However, the target utilization which can be achieved with magnetic fields known up to now is often very poor. A further problem with these magnetic fields is that the generation of parallel fields cannot occur with sufficient uniformity over the entire target front face.

Another feasibility is the so-called steered arc method described in U.S. Pat. No. 4,673,477. Through moved magnetic fields located more or less parallel to the target the arc spot incident perpendicularly to the target front face is here deflected laterally and a magnetic path (racetrack) similar to that in sputtering, is generated. Through the rotation of a magnet configuration behind the target the spark can be guided under strong acceleration over the target surface and thereby the erosion can be favorably affected. However, here also applies that there are regions on the target which do not have parallel magnetic field components and therewith invalidate the favorable properties of the very rapidly moved arc spot in the racetrack. In addition, this structure is relatively expensive by using the rotating magnet system and restricted to certain target geometries.

A further method for obtaining low-macroparticle layers is the technique of "filtered arc" described inter alia in U.S. Pat. No. 6,663,755. However, the equipment expenditure is here very high at a simultaneously strongly decreased deposition rate.

A method for generating parallel magnetic fields over a large portion of the target surface is described in U.S. Pat. No. 5,861,088 or DE 43 29 155, alternatively. By using two axially oriented coils, of which at least one is disposed behind the target, and a permanent magnet core, a field contour is here induced which generates within a concentric region (racetrack) predominantly parallel magnetic field lines on the target front face. The target erosion can be controlled through a suitable division of the current onto the coils. In order to keep the problematic central region of the target, at which the field lines are perpendicular with respect to the target front face, as small as possible, the disposition of the permanent magnet core in a recess formed in the backside of the target is proposed, which affects the mechanical stability of the target and requires an additional working step in the production of the target. As stated by the inventor himself in the subsequent application US 2004/0154919, a further disadvantage of this method is that the field strength changes with the erosion of the target, and that this can only with difficulty be compensated with the coils, which results in nonoptimal target utilization.

Alternatively, in order to improve the field guidance US 2004/0154919 proposes utilizing at least one magnetically soft iron yoke between the coils. Therewith the apex of the field line arc can be shifted toward smaller diameters. Regions of parallel field lines can here also only be shifted on the surface, however, not simultaneously be kept constant on the major portion of the target surface. Consequently, the arc spots move here also at highly different rates over the target surface, in particular in the case of materials which tend to a strong division of the arc footpoints (arc spots) (such as for example Al, AlCr, AlTi, AlSi, AlCrSi, TiSi. AlTiSi, . . . ).

An entirely different approach is proposed in U.S. Pat. No. 6,334,405 with a field line guidance which is substantially perpendicular to the target front face. The field-inducing coil or a magnet ring is here disposed at the same level as, or in front of, the target front face. Compared to the above listed methods, simultaneously markedly stronger magnetic fields are employed. Thereby the spark (arc) is said to be better distributed on the target, i.e. the number of arc spots is increased and therewith the energy per spot is lowered (footpoint splitting) and therewith smaller macroparticles are emitted.

DE 102 50 941 discloses a universal source, which can be switched over and is utilized as sputter source, in particular magnetron sputter source, and as arc source. For the purpose of taking into consideration the differences of sputter source and arc source, an exchangeable magnet system is provided and the generator feeding the particular plasma discharge is exchanged or switched over. To operate this universal source as an arc source, an ignition device for the arc, also referred to as cathodic arc discharge, must be provided and a low-voltage high-current generator capable of supplying the high current of 40-250 A during operation at a low discharge voltage (arc voltage) of 10-100 V, which is necessary for maintaining the arcs.

As sputter source sputter voltages of 50-1000 V are employed, corresponding to a sputter power of 0.5-10 kW, yielding discharge currents of the order of magnitude of 10 A.

WO 00/16373 discloses an arc source with a magnetic configuration such as will be discussed in connection with FIGS. 1, 2 and also 8.

Along the margin region of the target as well as about its central region, magnetic dipoles perpendicular to the target front face are herein provided having pole faces parallel to the target surface, from which the magnetic field with its field lines perpendicular to the target front face, exits and enters again.

In U.S. Pat. No. 5,298,136 the realization of a field contour over the target surface of an arc source, as described in connection with WO 00/16373, is also disclosed. Onto this field additional magnetic fields are dynamically superimposed.

DEFINITIONS

In the following the technical term "arc source" is synonymous with the older but cumbersome German term spark vaporizer source. This involves a PVD source, in which from a target by at least one, however most often several, arcs generated by means of a high-current discharge or cathodic arc discharges, also referred to as sparks, material is vaporized into a highly ionized state.

As is disclosed, for example, in DE 102 50 941, an arc source has an ignition device for the arc. In operation the arc discharge is fed by means of a low-voltage/high-current generator, which is capable of supplying at a low voltage of 10-100 V an arc current of 40-250 A or even higher.

By "axially" poled magnet system is understood a magnet system which is poled substantially perpendicularly to the front face of the target of an arc source and whose magnetic dipoles consequently are substantially perpendicular to said surface. The entry/exit faces for the magnetic field, which face the target, are therein substantially parallel to the target front face.

By "axial" components of the magnetic field are understood components which are perpendicular to the target front face, or, in the case of a nonplanar target front face, perpendicular to the tangential plane at the target front face, at the front face point closest to the spatial point considered with reference to the magnetic field.

By "radially" poled magnet system is understood a magnet system which is poled substantially parallel to the target front face of an arc source. Therewith the magnetic dipoles of this magnet system are substantially situated parallel to the target front face and it is their pole exit [or entry] faces from which the magnetic field perpendicularly exits or enters, respectively, substantially perpendicularly to said target front face.

By "radial" components of the magnetic field are understood components which are parallel to the target front face or, in the case of non-planar target front faces, parallel to the tangential plane at the target front face, at the front face point closest to the spatial point considered with reference to the magnetic field.

The central target region is defined by a line encircling the area center point of the target front face and at least predominantly follows the geometric locus which is fixed in position by half of the rays from said center point to the margin of the target. The target margin region adjoins the central target region toward the outside.

Where in the preceding and following, target front face is spoken of, in connection with parallelism and perpendicular relationships in this regard of magnet polings, of magnetic dipole directions, of magnetic field components, by this face is understood the surface of the target to be eroded by arc vaporization in its initial state. If this front face is already profiled, for example, graduated, in its initial state, in this case a face nestled on the target front face is understood.

The locus at which the field components $B_r$ which are parallel—radial—to the target front face, have the same absolute value or magnitude as the field components $B_z$ perpendicular—axial—thereto, is referred to as 45° locus, since here the magnetic field lines enter into or exit from the target front face at an angle of 45°.

When magnetic dipoles at a magnet system are discussed, which "at least predominantly" have a specific direction, it is understood that
 a) the addressed dipole vectors have a component in said direction which is greater than that in the other direction and specifically viewed in a plane perpendicular to the target front face and extending through its area center point,
 b) in the magnet system differently directed dipoles may also be present, however, in terms of the overall effect are of subordinate importance with respect to the resulting magnetic field.

DESCRIPTION OF THE INVENTION

The invention relates to an arc source with a target with a target front face for vacuum vaporization of the target material, a target backside—conventionally with a cooling device, for example a cooling plate, attached thereon—a central target region as well as a target margin region with the target margin. The arc source further comprises a magnet configuration with an inner magnet system in the proximity of the central target region and/or with an outer magnet system in the target margin region, for the generation of a magnetic field in the region of the target front face. At least one of the magnet systems is herein poled radially, i.e. it has magnetic dipoles substantially parallel to the target front face. By itself or in combination with the particular other magnet system it effectuates that at the target front face the magnetic field components parallel to the target front face—radially—in a region of at least 80% of the target front face are greater than the magnetic field components perpendicularly—axially—to the target front face.

The result is better utilization of the target as well as decreased formation of splatters.

With a magnet configuration of this type in one embodiment said region can even amount to at least 90% of the target front face.

In one embodiment the pole faces of the magnets forming the dipoles are substantially perpendicular to the target front face or even directed such that their face normal [vector] points away from said surface.

In one embodiment the parallel field components in the addressed region are 20 to 60, preferably 40 to 50 Gauss (in each case both limits inclusive).

In one embodiment a further reduction of the splatter formation is carried out thereby that in the central target region a cover electrically insulated from the cathode is disposed. If an inner magnet system is available, in one embodiment the region at least nearly up to—on the target front face from inward progressing outwardly—a first 45-[deg] locus is masked with this cover.

Therewith, on a target masked thusly it can virtually be excluded that the spark is running stable.

Such a cover inventive per se can be fabricated of a magnetically soft material, such as for example soft iron, and/or of a high-temperature resistant magnetic alloy and/or of an electrically insulating material. This cover can optionally be multilayered, with layers of at least two of said materials. If needed, said cover can additionally be cooled. As insulating cover material is suitable, for example $Al_2O_3$ or BN. By using electrically insulating material on the cover, the required electrical insulation of the cover with respect to the target can be realized simultaneously, in which case the additional provision of insulators between cover and target can be omitted.

A number of trials have furthermore shown that separation of the spark or arc from the target front face onto the surface of the cover can be effectively prevented through a cover counter-sunk flush with the target front face or even slightly into the target front face.

In one embodiment, depending on the thickness of the target, the counter-sinking is 0.5 mm-6 mm.

Provided, as is preferred in most cases, a cooling plate, for example with cooling water circulation, is available on the back side of the target, at least one of the magnet systems, in particular the inner one, is disposed in one embodiment on or in the target and/or the cooling plate, for example in a cooling water circulation or on the backside of the cooling plate facing away from the target. According to one embodiment the or the at least one magnet system is at least partially disposed in a recess on the target backside. The reduction of the target thickness due to this recess yields the advantage, for example, that weaker magnets can be utilized on the inner magnet system in order to attain the desired effect on the target front face.

If the target recess, wherein the inner magnet system is at least partially disposed, is implemented such that it continues through to the front side of the target, thus extends through the target, which for reasons of production technology may be simpler and which permits additional savings in the case of expensive target material, in one embodiment a cover is provided as described above in order to prevent the magnets of the inner magnet system from overheating. Additional measures for magnet cooling and for sealing of the vacuum side against atmospheric pressure and/or liquids from the cooling circulation are known to the person of skill in the art of vacuum or arc source technology and are therefore not explained in further detail.

In a further embodiment the magnet system with dipoles at least predominantly parallel to the target front face comprises permanent magnets, disposed in a plane substantially parallel to the target front face and distributed substantially uniformly along a closed loop, with dipoles directed identically with respect to the loop.

If both, i.e. the inner and the outer magnet system, include such closed loops with radially poled magnets, i.e. magnetic dipoles substantially parallel to the target front face, in one embodiment the poling of the inner magnet system is chosen identically to the poling of the outer magnet system, i.e. the magnetic dipoles at both closed loops are either directed from the central target region outwardly or toward the central target region. Therewith the inner as well as also the outer magnet system have identically directed south and north poles located inside or outside, respectively, with respect to said loops.

In a further embodiment of the arc source according to the invention the or the at least one magnet system comprises a coil. By providing a coil at one of the magnet systems, the effect of this magnet system can be made to be variable.

In a further embodiment the outer magnet system is implemented such that at least portions of it project beyond the target margin.

In further embodiments only the outer magnet system is available on the arc source according to the invention, which magnet system comprises dipoles at least predominantly parallel to the target front face, or only the inner magnet system is available which comprises, at least predominantly, dipoles parallel to said target front face. In a further embodiment the outer as well as the inner magnet system is provided, at least one of it with dipoles at least predominantly parallel to the target front face, the other with dipoles at least predominantly perpendicular to the target front face, or in a further embodiment with both magnet systems at both [magnet systems] dipoles are provided at least predominantly parallel to the target front face, preferably, as explained above, directed identically radially.

In a further embodiment, again, outer and inner magnet systems are provided and disposed substantially in one plane.

In an arc source according to the invention, which comprises an outer and an inner magnet system, the outer magnet system, in particular an outer magnet system with dipole orientation perpendicular to the target front face, such as is realized by means of a closed loop of permanent magnets, is located in one plane with the provided inner magnet system. In this case an inner magnet system with dipoles at least predominantly or exclusively parallel to the target front face is fronted by an outer one with a dipole orientation at least predominantly or exclusively perpendicular to the target front face. Here optionally the outer magnet system and/or the inner one can have magnetic dipoles which are oriented parallel to the target front face and dipoles oriented perpendicularly to the target front face. In a further embodiment, in which both magnet systems are provided, the outer one has along a closed loop at least predominantly magnetic dipoles oriented perpendicularly to the target front face, a coil encompassing substantially along the loop is provided, as was in general explained above.

If an arc source is to be realized which is to be especially well adaptable with respect to the target material or to different target thicknesses, a coil can be utilized as a part of said outer and/or optionally inner magnet system. This coil forms a part of the corresponding magnet system, wherewith it becomes possible to shift or to vary especially the contour or the magnitude, respectively, of the field components $B_z$ perpendicular to the target front face by applying different coil currents.

If the outer magnet system is comprised, for example, of a coil loop and a permanent magnet loop with dipoles parallel and/or perpendicular to the target front face, formed by permanent magnets, this outer magnet system with the permanent magnets can be laid out for optimal operation with standard target materials and/or standard target thicknesses. For the arc vaporization of other materials and/or when using non-standard target thicknesses, the optimal conformation of the magnetic field is set with the coil.

In a further embodiment of the arc source according to the invention the or at least one of the provided magnet systems is disposed on or behind the target backside.

In a further embodiment is proposed that the target and the or the at least one magnet system—disposed behind the target backside—are separated from one another under vacuum sealing. It becomes thereby possible to implement in a further embodiment the or the at least one magnet system as a part of a changeover magnet configuration.

Therewith the feasibility results of increasing the flexibility of applying the arc source according to the invention thereby that the magnet system implemented as a part of the changeover magnet configuration can be readily exchanged for different source applications. Thereby that the target and the or the at least one magnet system, which is part of the changeover magnet configuration, are vacuum-sealed against one another, it becomes possible to position said magnet system when it is in operation under normal atmospheric pressure, which permits readily exchanging the changeover magnet configuration without intervening in the vacuum system and providing corresponding means known to the person of skill in the art such as rapid closures, guide means, etc.

A magnet configuration according to the invention, in particular for use as changeover magnet configuration, is disclosed herein. A production method according to the invention of arc-coated workpieces is obtained thereby that material is vaporized with at least one arc from a target face on which a magnetic field with first magnetic field components parallel and second magnetic field components perpendicular to the target face is generated by means of employing magnets with dipoles parallel to the target face such that over at least 80% of the target face the first magnetic field components are greater than the second and herein the workpiece is coated with a material comprising the vaporized target material.

DESCRIPTION OF THE DRAWING

In the following the invention will be explained in further detail in conjunction with figures showing different embodiment examples. In the drawing depict:

FIG. 1 shows a schematic cross section through an arc source of prior art. About the target front face 2 of a target 1 mounted on a cooling plate an encircling confinement ring 3 is disposed for delimiting the spark on the target front face. A counterelectrode, most often an anode, which conventionally is also encircling, is not shown here. In the central rearward region of the target is located a power supply 5, which may comprise cooling water inlets and outlets, also not shown here. As stated in the introduction, the central target region is defined as the region Z with the area center point S of the target front face 2 and is at least predominantly framed by a geometric locus, which results through the division of the connection rays from center point S to the edge of the target front face.

In the central rearward region is also located an inner magnet system 6 realized as a permanent magnet ring. In the outer region A of the target 1 is disposed an outer magnet system 7 realized as a permanent magnet ring. Both magnet systems are axially magnetized in opposite polarity with dipoles $D_6$ and $D_7$, respectively, perpendicular to the target front face 2, such that a portion of the field lines exiting from the pole face $P_7$ of the outer system 7 enter again into the pole face $P_6$ of the inner [magnet system] 6, while the contour of the field lines on the backside of the magnet systems is substantially a mirror image with respect to the ring plane E.

The critical pole faces $P_7$ and $P_6$ are parallel to the target front face 2 and on these faces the magnetic field lines in any case exit perpendicularly.

Figure 2:
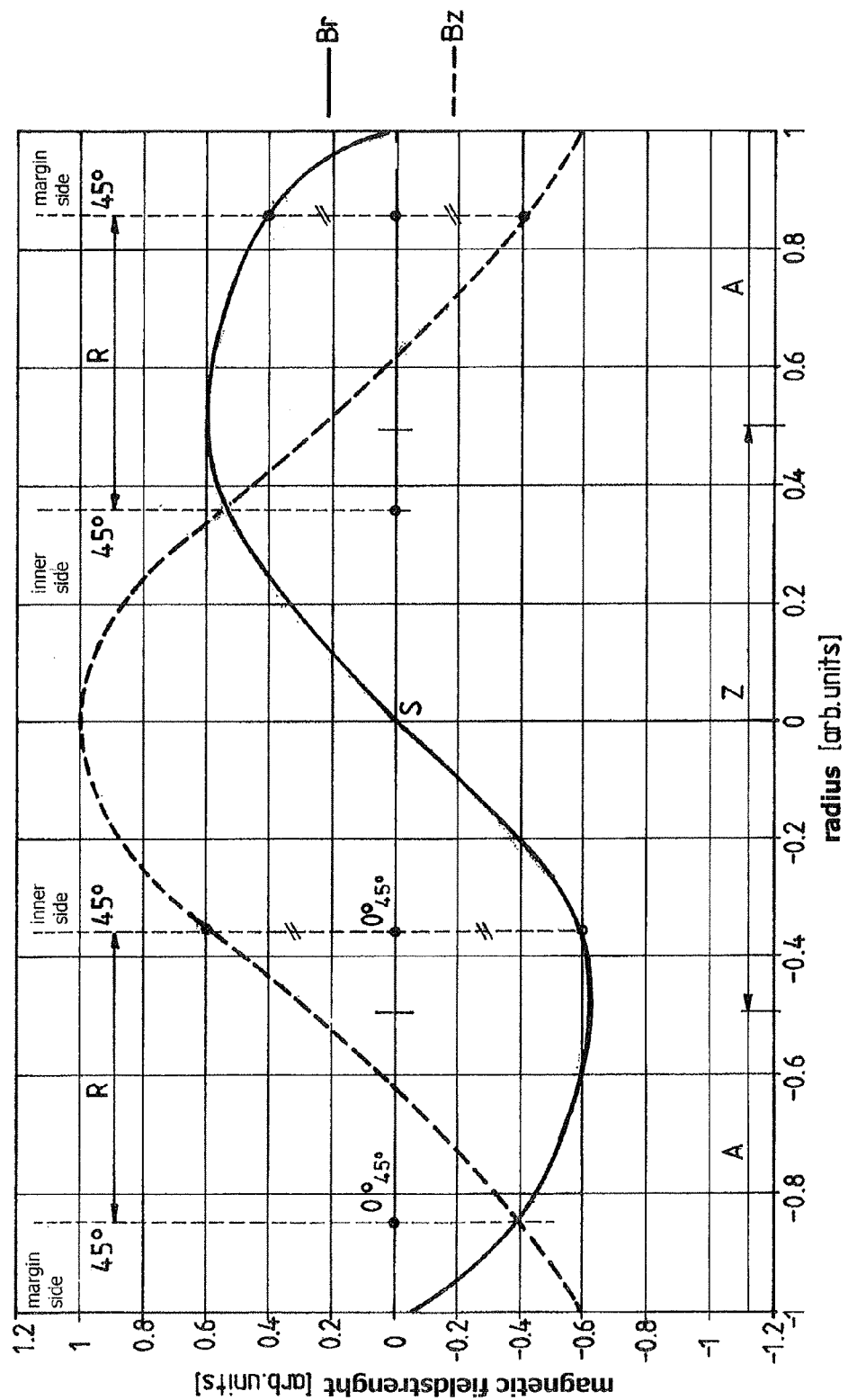

FIG. 2 depicts the contour of the field lines on the target front face generated through such a configuration, divided into a radial component $B_r$, parallel to the target front face, and an axial component $B_z$ perpendicular to the target front face 2. At the outer target region A or in the central region Z of the target a relatively small increase or decrease, respectively, of the absolute value of the radial field component $B_r$ can be seen, while the axial field component $B_z$ increases largely quasi-linearly toward the target center S (0 point of the abscissa). The 45° loci $O_{45°}$ on the target surface denoted by the end points of arrows R are thereby located relatively far toward the center of the target. The areal region R with magnitudes Br greater than Bz is thereby relatively small.

Figure 3:
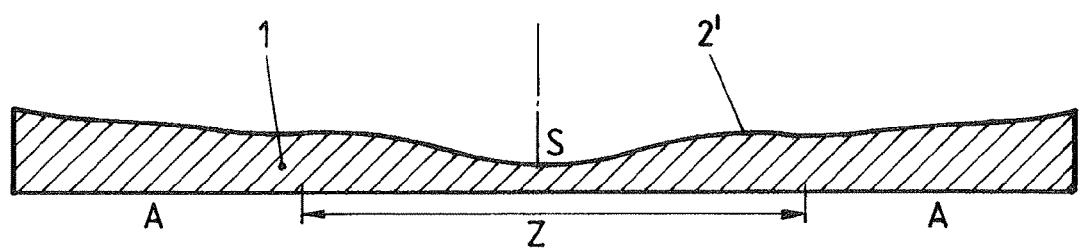

Due to the radial components Br which in the interior of the central target region Z is very small, the arc footpoint moves slowly here, the dwelling probability of the spark in this region is relatively high, which leads to intensified erosion of target material and a erosion profile 2', depicted in FIG. 3, with poor target utilization. In this case, due to the deep erosion in the central target region Z alone, the target must be replaced. If, due to the low radial deflection, the spark is stationary at the same location of the target and burns stationarily, even if only briefly, overheating occurs and, as a consequence, explosive vaporization phenomena on the target front face with all of the disadvantageous results, such as superproportional material removal and droplet formation or deposition on the parts to be coated.

Figure 4:
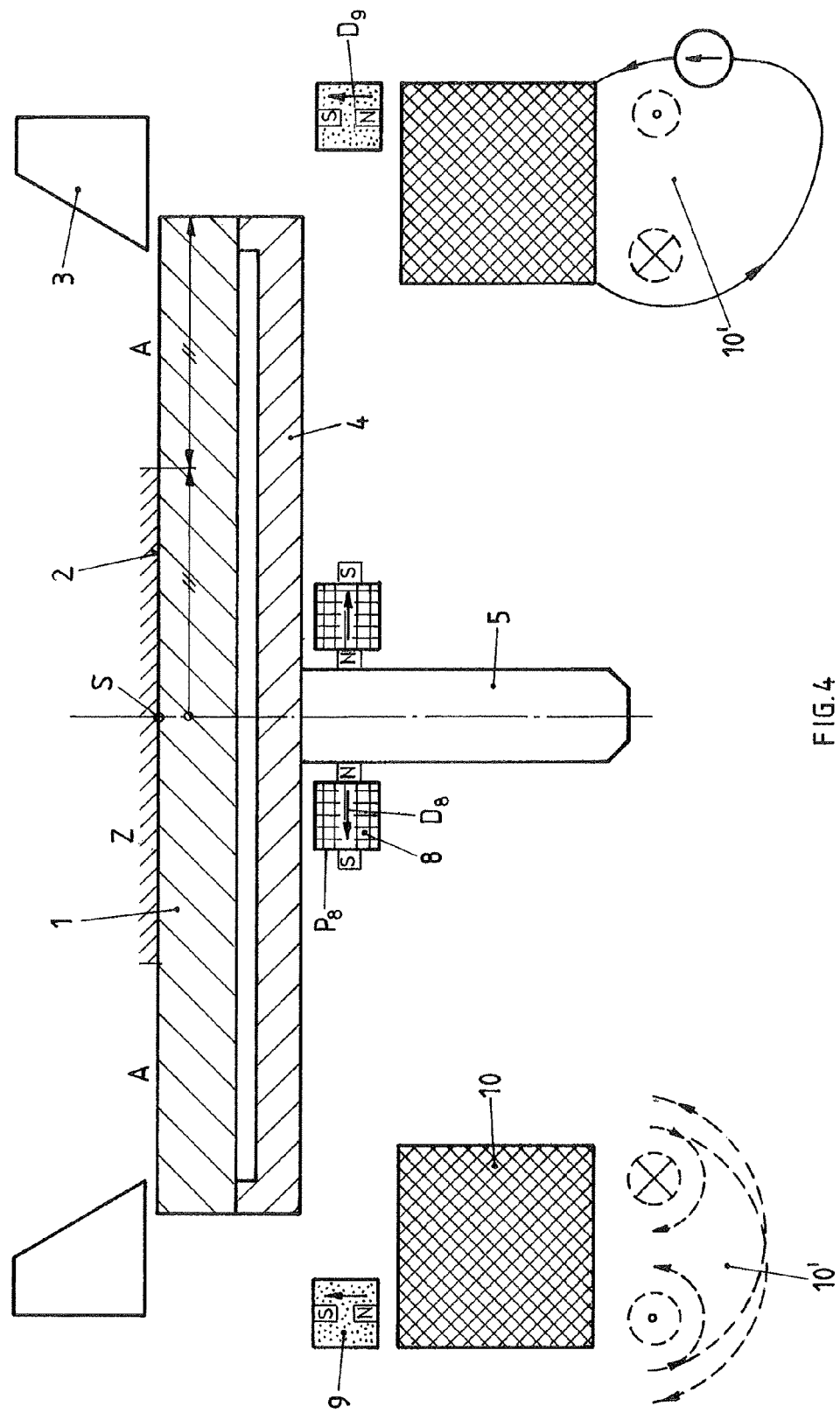

FIG. 4 shows an arc source of identical installation geometry, however, in an embodiment according to the invention. The magnet configuration comprises here also an inner 8 and an outer magnet system 9, 10, however, in this case the inner magnet ring or an inner closed magnet loop is at least predominantly radially poled, wherewith the dipoles $D_8$ are at least predominantly oriented parallel to the target front face 2. The magnet ring of the outer system 9, 10 is furthermore at least predominantly axially poled, wherewith the dipoles $D_9$ are at least predominantly perpendicular to the target front face 2. The pole faces $P_8$ of the inner magnet system 8 are at least predominantly oriented perpendicularly to the target front face 2. With such a magnet system configuration a magnet field is generated such as is depicted by example in FIG. 5. The 45° loci $O_{45°}$ marked by the end points of arrows R' on the target front face are here shifted markedly closer to the target margin (outer locus $O_{45°}$ or toward the target center (inner locus $O_{45°}$), wherewith the areal region R' is significantly larger than the areal region R of FIG. 2.

Figure 5:
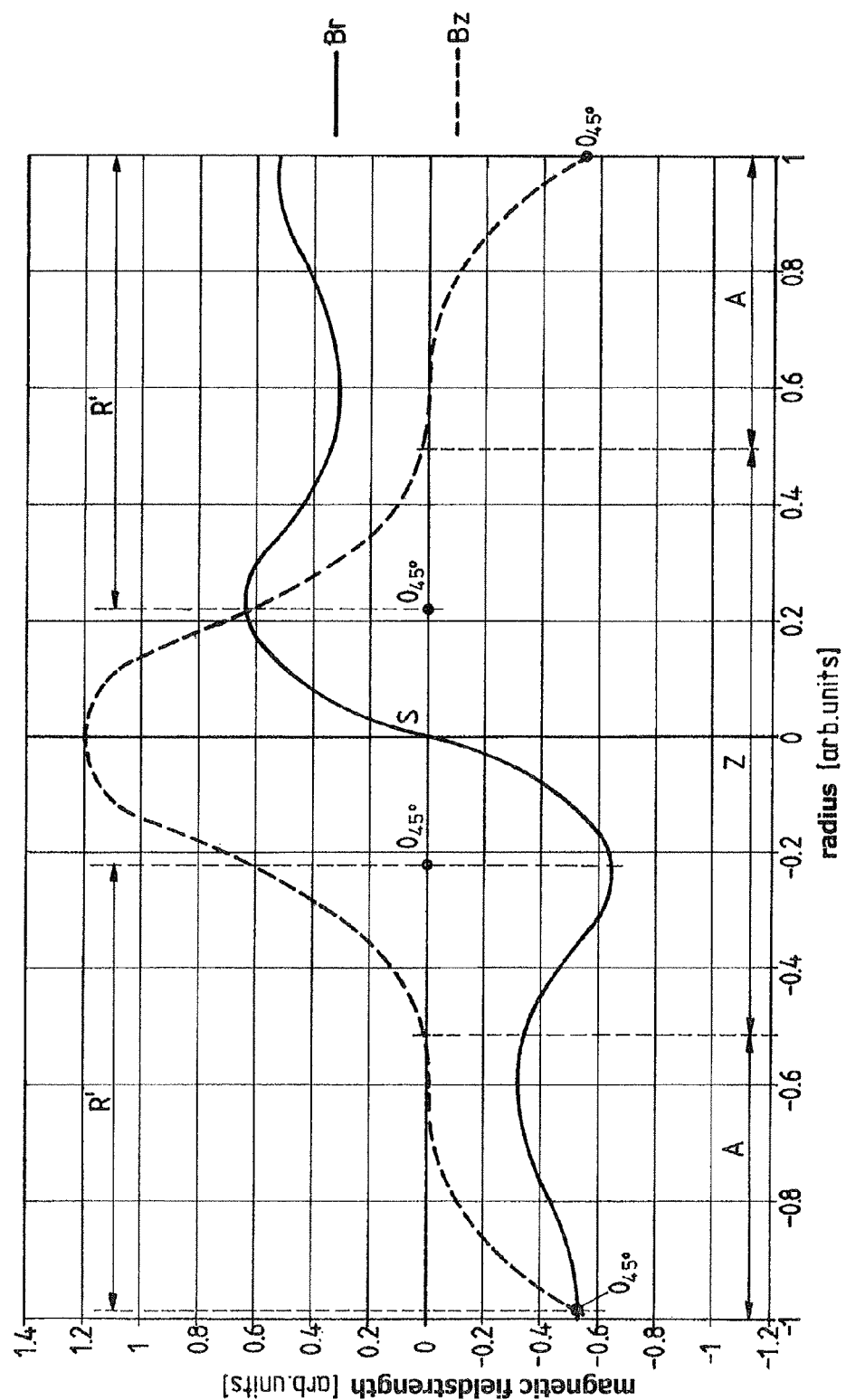

While at an assumed circular plate-shaped target front face such a region according to FIG. 2 amounts to 58% of the target front face, at which the magnitude of $B_r$ is greater than the magnitude $B_z$, this region, in the case of the arc source according to the invention and result according to FIG. 5, is 96%.

Figure 6:
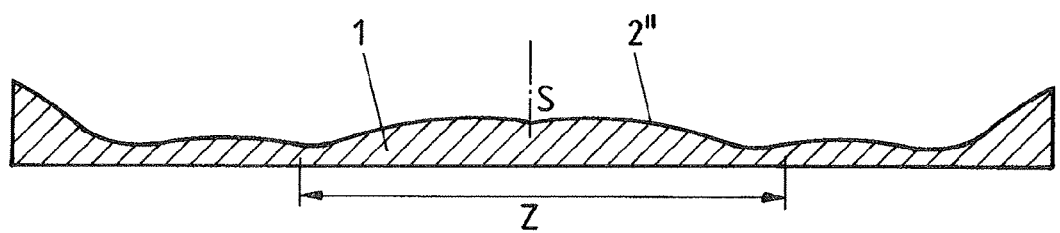

FIG. 6 shows an erosion profile generated by such a magnet system configuration according to the invention. In the central region Z of the target the region of small radial—$B_r$—and large axial—$B_z$—field components is very small, therewith the footpoint of the spark discharge moves at relatively high speed toward or through the central region Z, whereby an excessive erosion up to the target center is effectively prevented. In the target center therefore only a very weakly defined erosion maximum is detectable. In such a magnet configuration the spark dwells longest in the region with high radial component Br, thus where the spark experiences high tangential deflection and causes here also the relatively greatest erosion. With such a magnetic field the target material can be removed fairly uniformly up to the edge. The outer magnet system 9, realized with a magnet ring or along a closed loop, is here advantageously implemented with a diameter equal to or slightly larger than the target diameter.

Figure 7:
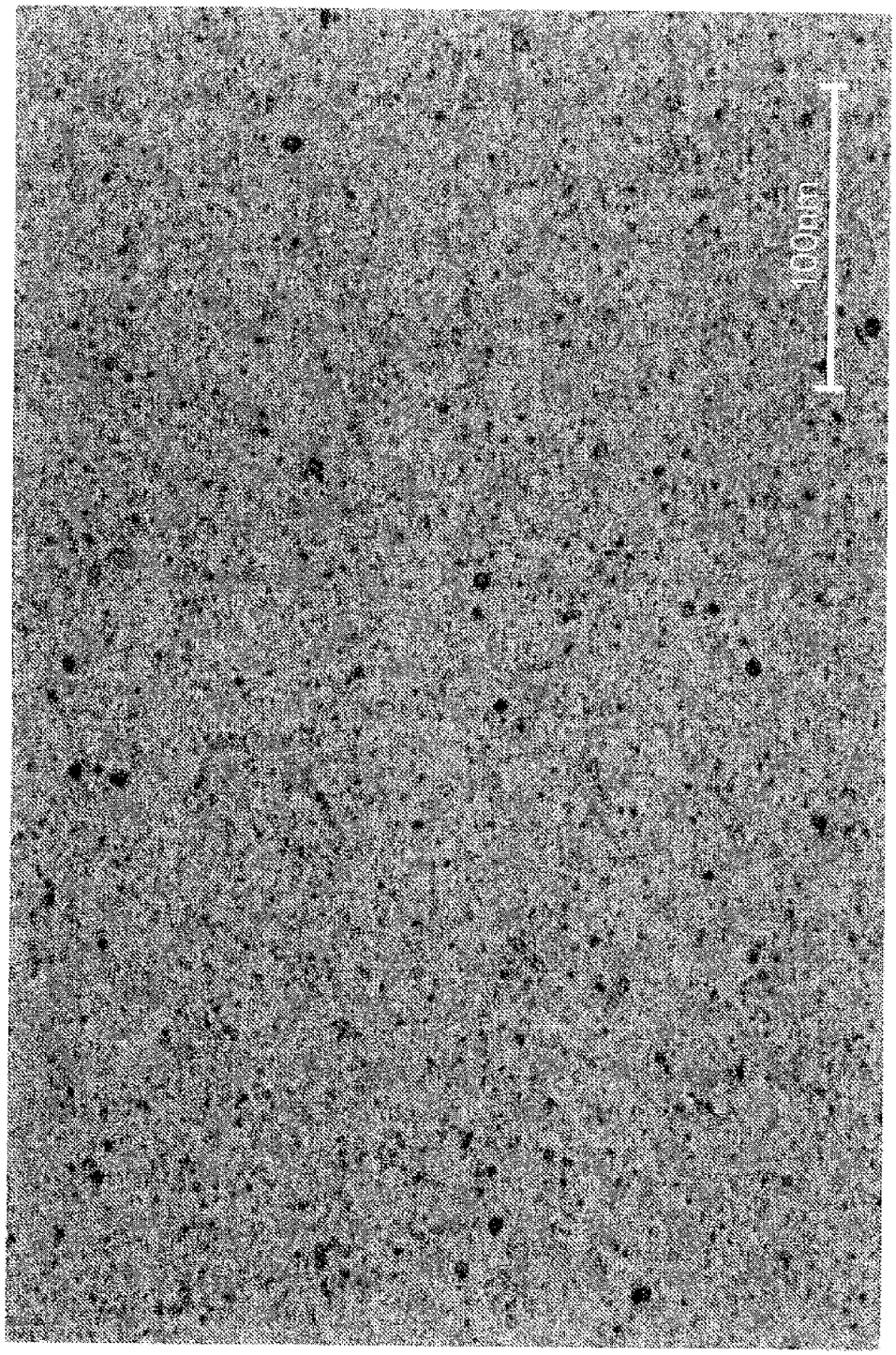
Figure 8:
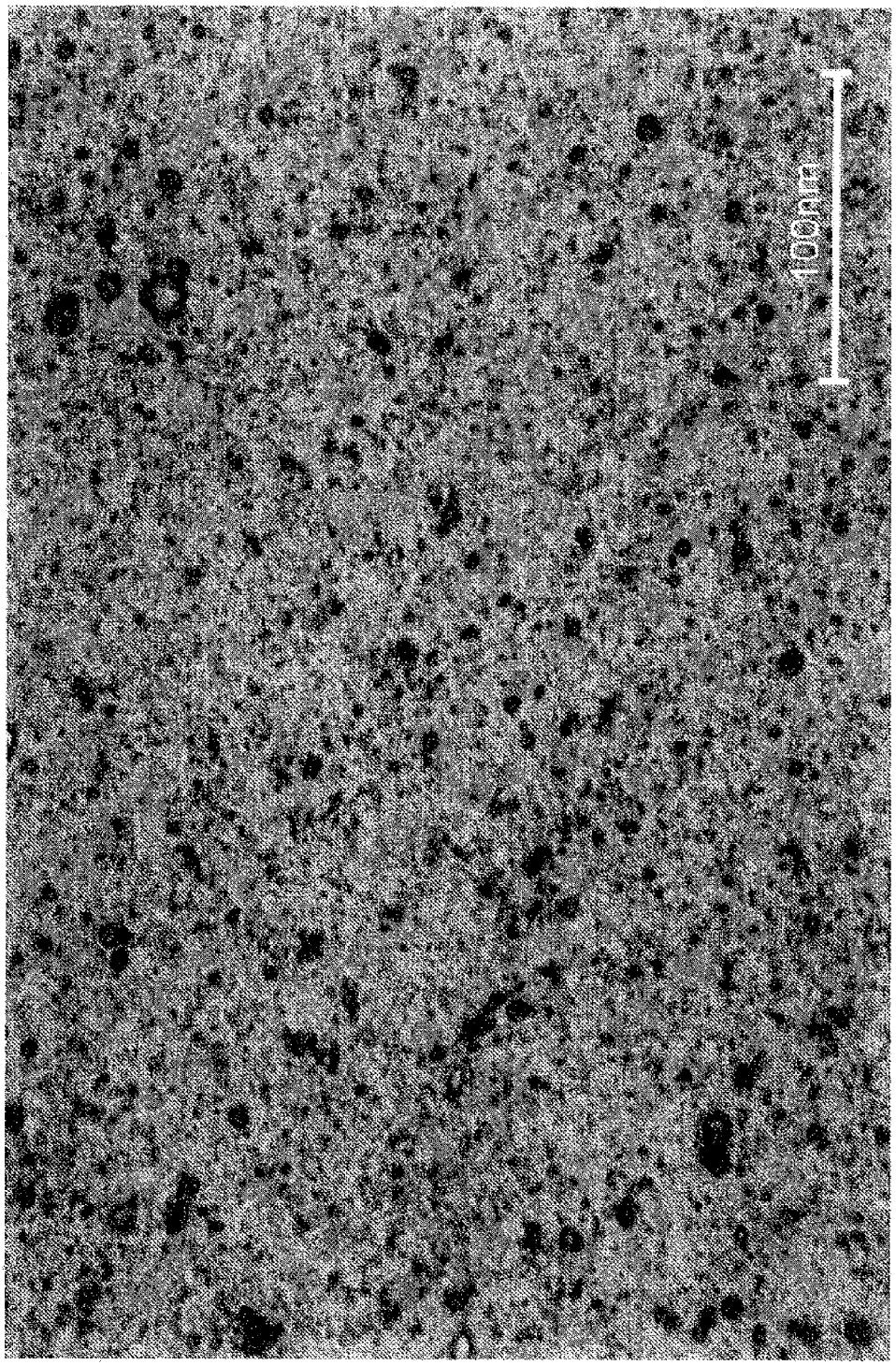

Consequently, according to the invention a significantly better utilization of the often expensive target material is achieved and simultaneously the layer properties improved. The TiN layer, produced with an arc source according to the invention in FIG. 7, under conditions otherwise identical conditions as that produced in FIG. 8 with a conventional magnet system, shows a significantly smoother surface: the average size of the droplets is significantly decreased according to the invention.

Figure 9:
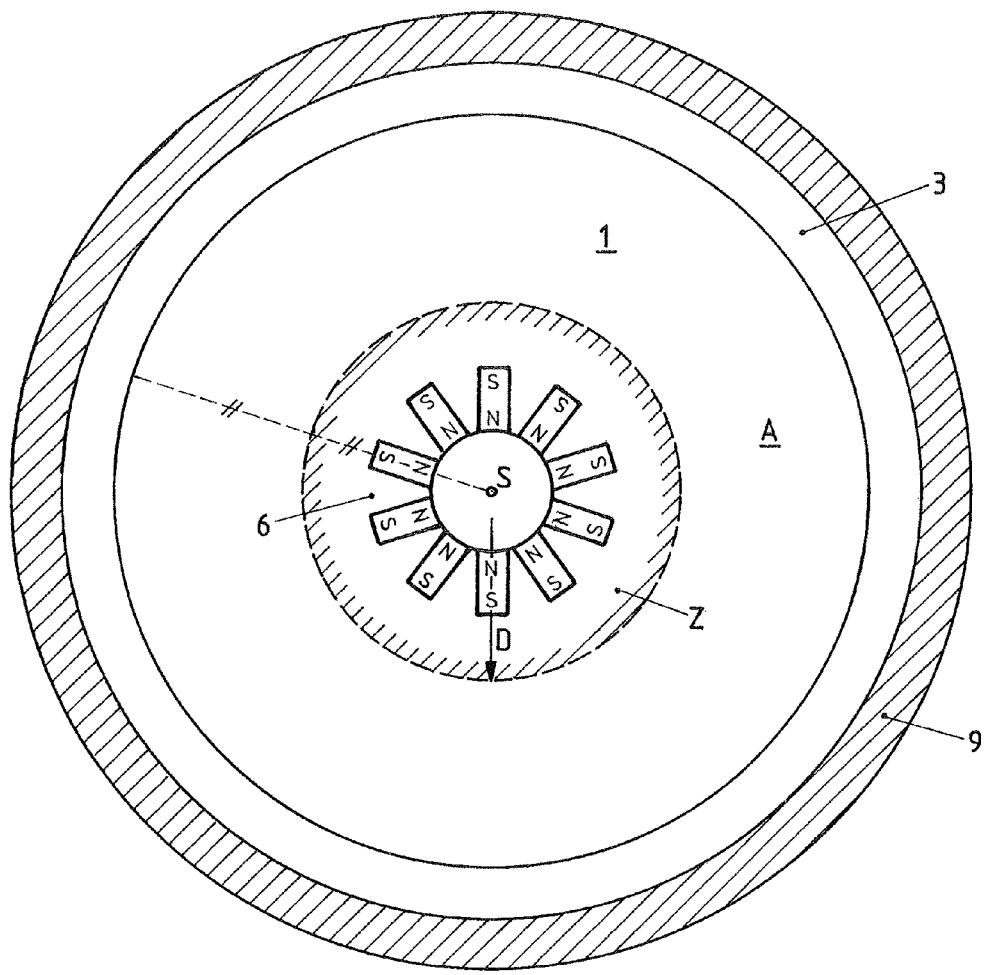
Figure 10:
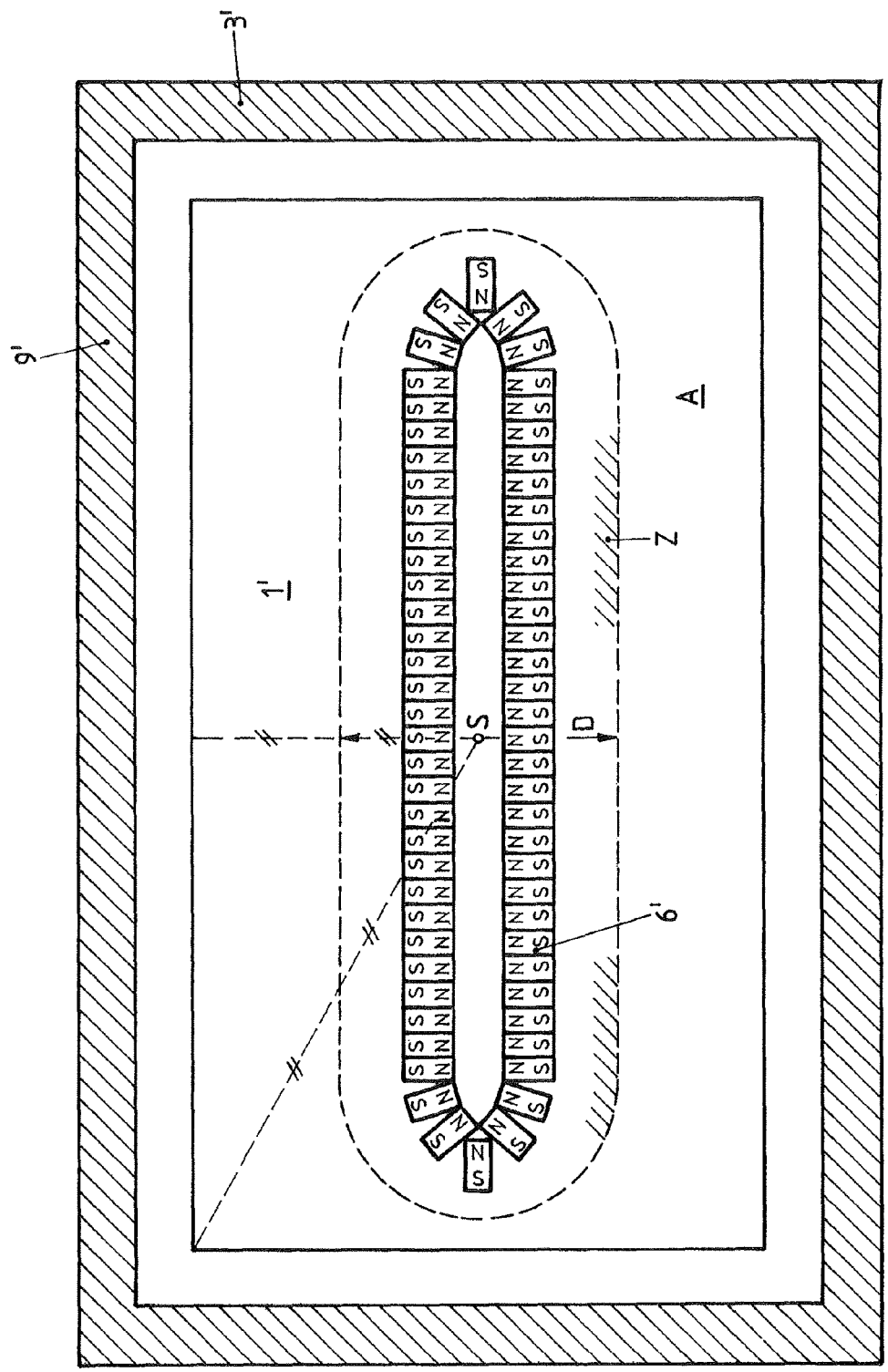

FIG. 9 shows by example in top view onto the target backside, the fundamental structure of a round arc source, FIG. 10 that of a rectangular arc source, each with an inner axially poled magnet system 6, 6' along a closed loop. The loops are spanned by individual magnets, which are each disposed with identical polarity direction D directed toward the inside or outside.

Although a magnet configuration according to the invention or an arc source according to the invention can, in principle, be operated with only one radially poled magnet system, a configuration, fundamentally as shown in FIG. 4, with at least one additional axially poled magnet system is advantageous for many target materials. Advantageous effects can also be attained through the combination of at least two radially poled magnet systems.

Figure 11:
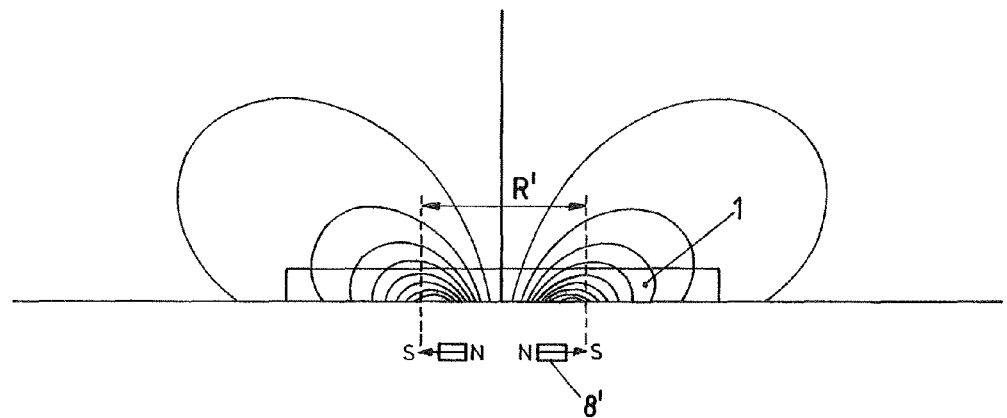
Figure 12:
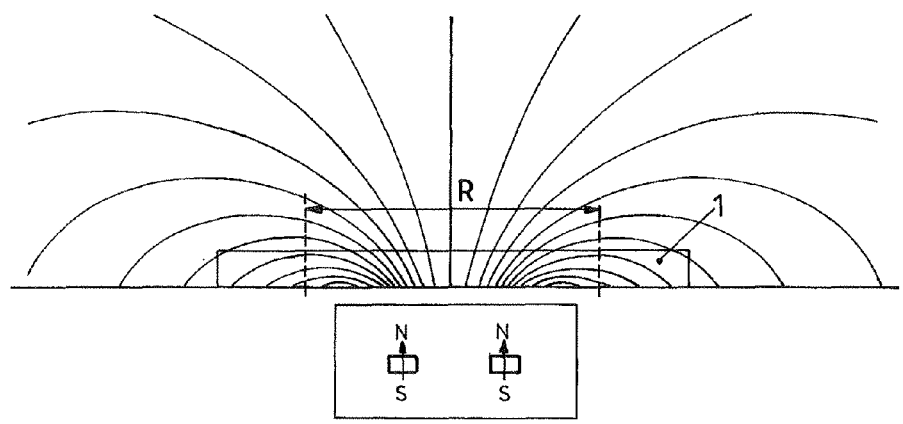

FIG. 11 depicts the spatial magnetic field of an inner magnet system 8'. FIG. 12 depicts in comparison a field corresponding to prior art with axially poled magnets of similar geometry. The different size of the regions R and R' on the target front face can here be seen especially clearly.

Figure 1:
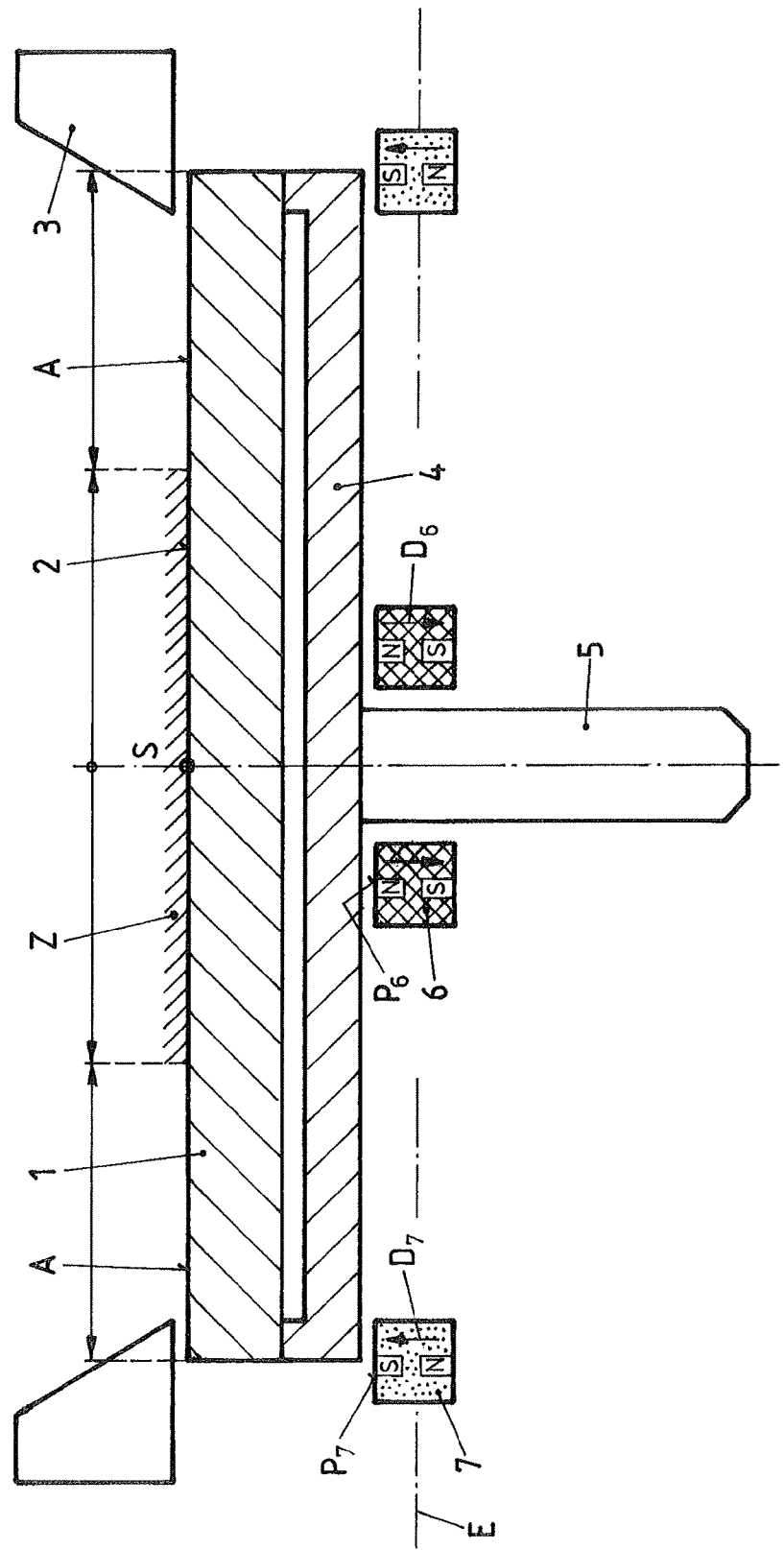
FIG. 1 simplified and schematically an arc source according to prior art with inner and outer magnet system, FIG. 2 the magnetic field on the target surface realized with a source according to FIG. 1, divided into components parallel to the target front face (radial components, $B_r$) and components perpendicular to the target front face (axial components $B_z$), FIG. 3 the erosion profile on the target realized by means of a source according to FIG. 1, FIG. 4 a realization form of an arc source according to the invention in a representation analogous to that of FIG. 1, FIG. 5 the magnetic field realized by means of the arc source according to the invention according to FIG. 4 in a representation analogous to that of FIG. 2, FIG. 6 a target erosion profile realized by means of the arc source according to the invention according to FIG. 4 in a representation analogous to that of FIG. 3, FIG. 7 the granularity of a TiN coating surface when coating by means of an arc source according to the invention according to FIG. 4, FIG. 8 the coating surface granularity when coating with an arc source according to prior art of FIG. 1 in a representation analogous to that of FIG. 7, FIG. 9 in backside view schematically a circular target with inner magnet system in the central target region provided according to the invention, FIG. 10 a rectangular target with inner magnet system in the central target region provided according to the invention in a representation analogous to that of FIG. 9, FIG. 11 over the target front face the magnetic field with radial poling realized through a magnet system utilized according to the invention, FIG. 12 the magnetic field with prior-art axial poling of a magnet system in a representation analogous to that of FIG. 11, FIG. 13 an embodiment of an arc source according to the invention or a magnet configuration according to the invention on the arc source in a schematic, simplified representation, FIG. 14 a further embodiment in a representation analogous to that of FIG. 13, FIG. 15 with reference to a target, three further embodiments according to the invention of magnet configurations at an arc source according to the invention, FIG. 16 a further optimization parameter, namely pole face direction on magnets utilized according to the invention and radially poled, FIG. 17 the variation region of the axial field components, such as realized with a controllable coil configuration provided at an the outer magnet system according to FIG. 4, in a representation analogous to that of FIG. 5, FIGS. 18 and 19 optimized target erosion profiles realized according to FIG. 17 by means of variably optimized magnetic field, FIG. 20 a further embodiment of a arc source according to the invention depicted schematically and simplified, FIGS. 21 and 22 further embodiments of the arc source depicted in FIG. 20, FIG. 23 again, simplified and schematic, the configuration of the or of at least one of the magnet systems provided according to the invention on the backside of the target, FIGS. 24 and 25 further embodiments of the configuration according to FIG. 23, FIG. 26 shown schematically and simplified, precautionary measures in order to make the magnet system configuration provided according to the invention accessible from the outside of a vacuum receptacle and without impairing the vacuum, and FIG. 27 shown simplified and schematically a magnet system configuration according to the invention and implemented as changeover magnet configuration.
Figure 13:
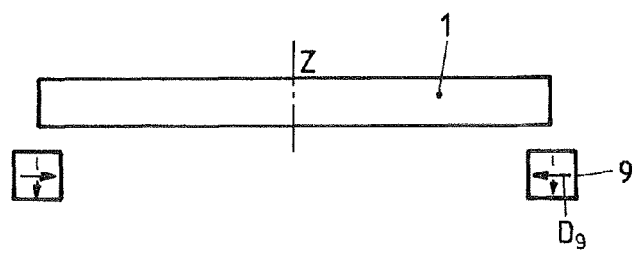
Figure 14:
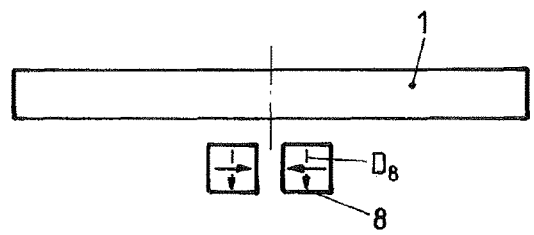
Figure 15:
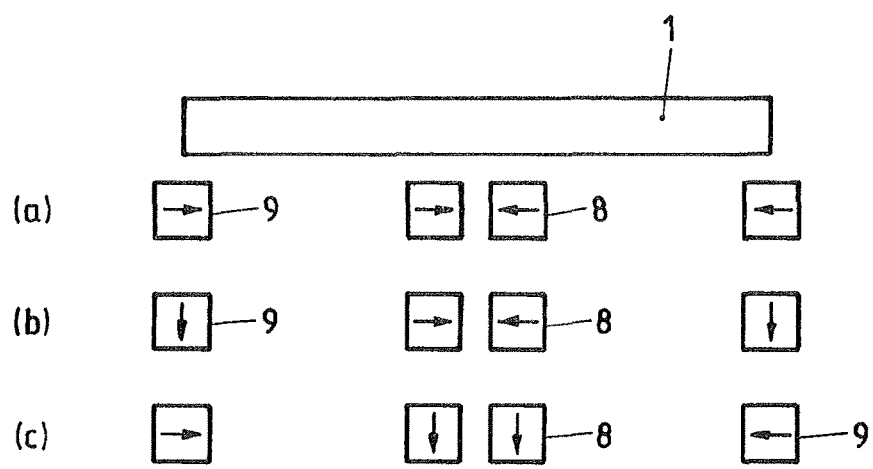

FIGS. 13 to 15 show schematically and in representations analogously to those of FIG. 1 or 4 further forms of magnet system configurations at the arc source according to the invention. Common to all is at least one magnet system, with, for example according to FIG. 11, at least predominantly radial poling.

According to FIG. 13 only the outer magnet system 9 is provided. It is, at least predominantly, radially poled, i.e. the dipoles Dg are at least predominantly oriented parallel to the target front face. However, it is entirely possible to provide thereon also magnets with axial poling, i.e. with dipoles perpendicular to the target front face, however with subordinate effect on the entire magnetic field.

According to FIG. 14 only an inner magnet system 8 is provided. It is also, at least predominantly, poled radially, i.e. with magnetic dipoles D8 at least predominantly parallel to the target front face. Here also, with subordinate effect, optionally magnets can be provided with axial poling, i.e. with dipoles perpendicular to the target front face.

According to FIG. 15(a) an inner as well as also an outer magnet system 8 and 9, respectively, are provided. Both magnet systems are at least predominantly axially poled, i.e. with magnetic dipoles which are at least predominantly parallel to the target front face. The dipole directions of the inner and of the outer magnet system can, as shown and as preferred, here be directed in the same direction, however, optionally also be directed inversely. According to FIG. 15(b), again with an inner and an outer magnet system 8 and 9, respectively, the inner system 8 is at least predominantly radially poled, while the outer system 9 is at least predominantly axially poled. Conversely, according to FIG. 15©, the inner magnet system 8 is at least predominantly axially poled, while the outer system 9 is at least predominantly radially poled.

Figure 16:
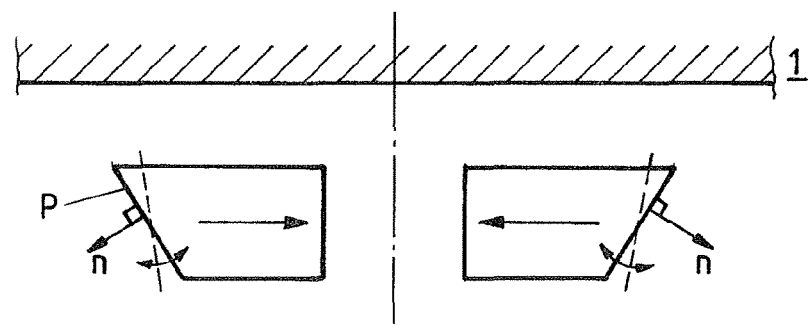

Furthermore and in view of FIG. 11 the magnetic field contour according to FIG. 16 can be optimized by setting the direction of the pole faces P with their face normal [vectors] n with respect to the target front face. With the pole faces P inclined in FIG. 16 away from the target face results a further enlargement of the region on the target front face along which the radial field components, i.e. those parallel to the target front face, which are perpendicular thereto, the axial [components] predominate.

As further already shown in FIG. 4, in particular on a provided outer magnet system 9 implemented in the form of a loop, a coil configuration 10 can be provided, by means of which the magnetic field contour over the target front face can be optimized depending on the form of the target material or the thickness of the target. Optionally, (not shown) such a coil configuration can also form a part of the inner magnet system. As indicated in FIG. 4 in dashed lines at 10', such a coil configuration can comprise several, for example two, coils, such that by selecting the directions of the coil current the effect on the field can be realized even more specifically.

Figure 17:
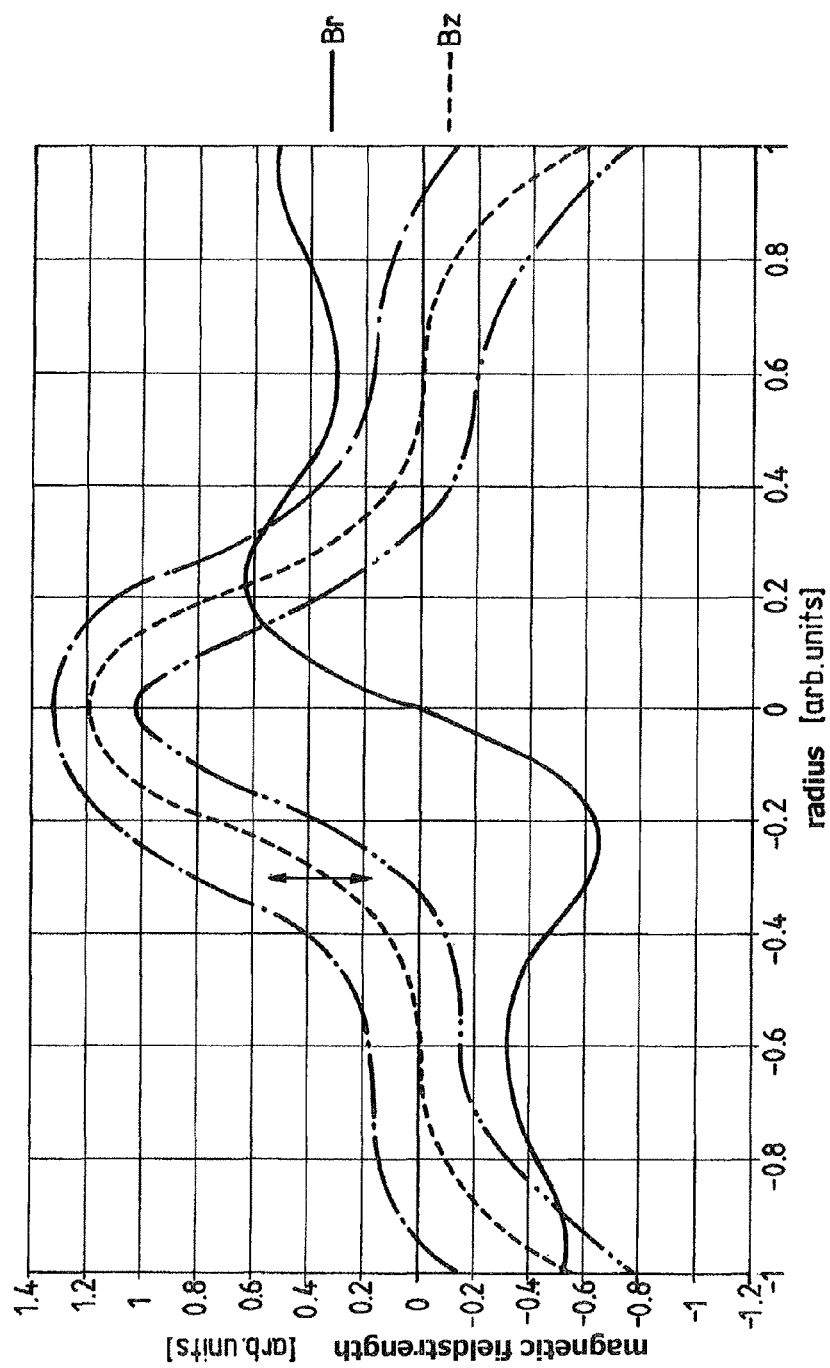
Figure 18:
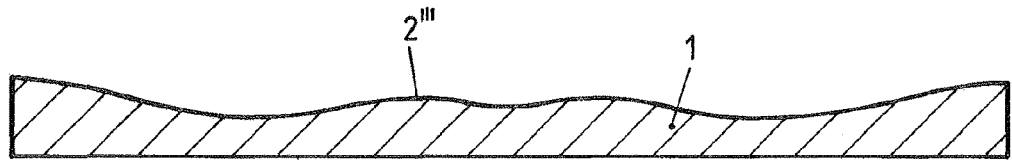
Figure 19:
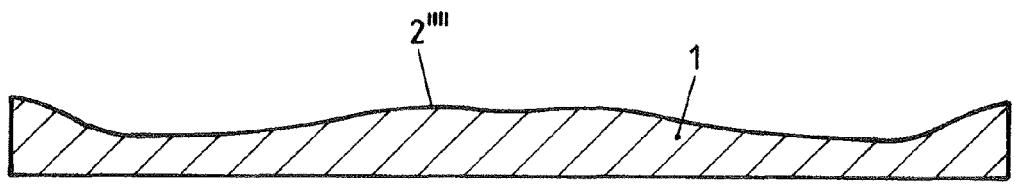

Flexible, for example matchable to different target materials or different target thicknesses, is consequently an arc source according to the invention in an embodiment, in which additional coil configuration 10, 10' is provided. Therewith, for example in the embodiment according to FIG. 4, the vertical magnetic field components $B_z$, shown in dashed lines in FIG. 17 and induced substantially through the axially poled magnet ring 9, 10, depending on the poling of the coil, can be shifted toward higher or lower values (dot-dash lines). Therewith, as shown by example in FIG. 18 or 19, the erosion profile 2''', 2''' of target 1 can be further optimized. The coil current, and therewith the magnetic field, are set for the particular material or the particular target thickness. Alternatively, the coil current can also be dynamically adapted during the arc vaporization or, for example, be changed periodically.

Figure 20:
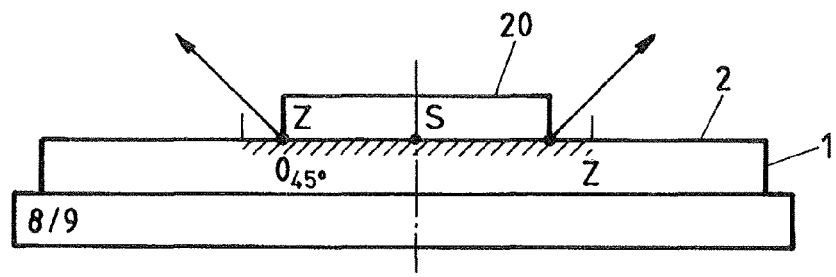

According to the schematic illustration of FIG. 20, in a further embodiment of the arc source according to the invention a cover 20 is provided within the central target region Z. It extends in a further embodiment up to the first locus $O_{45°}$, when progressing from area center point S on the target front face 2 outwardly.

The cover 20 is electrically insulated with respect to the target front face 2 and, consequently, to target 1.

Figure 21:
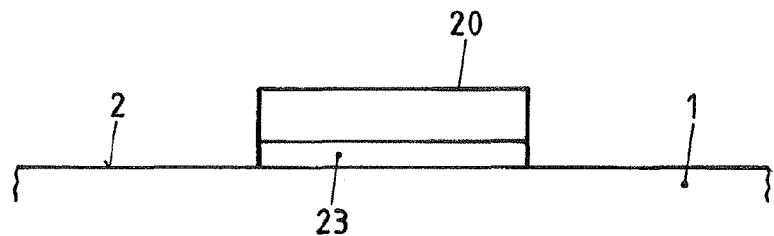

The cover 20 is preferably comprised of magnetically soft material, such as for example, of soft iron or a high-temperature resistant magnetic alloy or of an electrically insulating material. As shown in FIG. 21, the cover 20 can be structured in a layer structure, in particular with layers of said materials. If, as shown in FIG. 21, at least the portion of the cover 20 facing the target front face 2, is comprised of insulating material 23, additional measures for ensuring the electrical insulation of the cover 20 from target 1, become superfluous.

Figure 22:
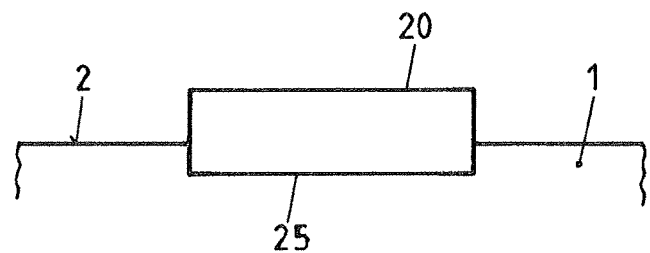

In FIGS. 20 and 21 the cover 20 is realized such that it rests flush on the target front face 2. In a further embodiment according to FIG. 22 the cover 20, structured as described, is counter-sunk into the target front face, as shown schematically at 25, while maintaining the electrical insulation. The counter-sinking of the cover 20 is therein preferably between 0.5 mm and 6 mm (both limits inclusive).

Figure 23:
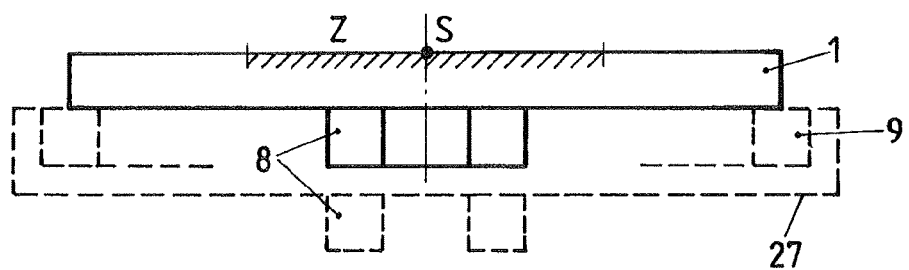

In FIG. 23 is further depicted schematically the manner in which one or both of the magnet systems provided according to the invention is or are disposed with respect to the target 1. This configuration is only shown in conjunction with the inner magnet system 8. In this embodiment it is located on the backside of target 1. An outer magnet system 9, shown in dashed lines in FIG. 23, can likewise be disposed on the target backside alone or in combination with an inner magnet system 8. If further, as also entered in FIG. 23 in dashed lines, and as is customary, on the backside of target 1a cooling means, such as a cooling plate 27, is provided, the provided magnet systems 8 and/or 9 disposed on the backside of the target 1 are provided in corresponding acceptances on the cooling means 27 and cooled jointly by the provided cooling medium or by the provided cooling action of the cooling means 27.

Figure 24:
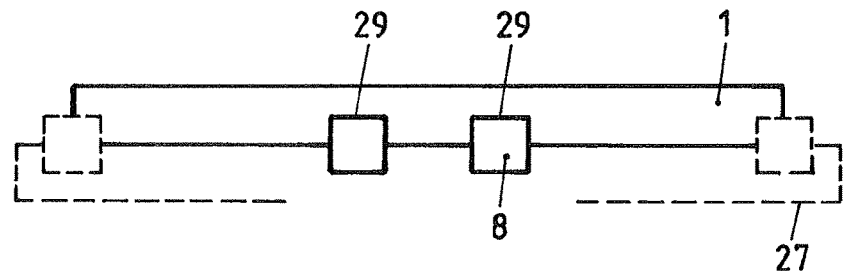

Building on the configuration shown schematically in FIG. 23, in the configuration according to FIG. 24 the provided magnet systems or at least one, and preferably the inner one, if provided and as also shown in FIG. 24, is set into the backside of target 1. Due to the recesses 29, necessary for this purpose, on the backside of the target 1, on the one hand, a saving of potentially expensive target material results and, on the other hand, an improved penetration coefficient of the magnetic field through the target to its front face.

The conventionally provided cooling means is again indicated by 27.

Figure 25:
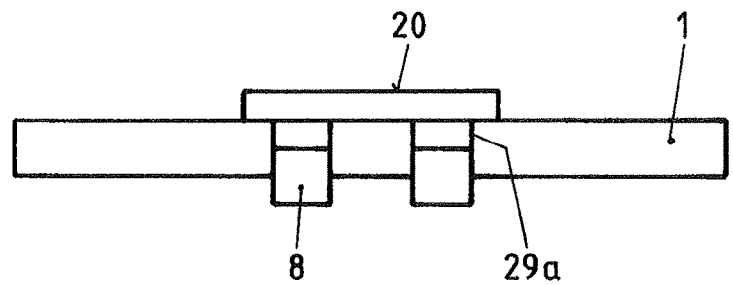

If, as shown schematically in FIG. 25, the recesses 29a for receiving the or the particular magnet system(s), in particular of the inner one 8, are implemented such that they are continuous through the target, thereby, on the one hand, a further saving of potentially expensive target material as well as a potentially further improved penetration coefficient for the magnetic field through the target results. In this case the continuous recesses 27a are closed with a cover at the side of the target front face. In the case of such recesses as depicted for the inner magnet system 8, they are closed with a cover such as had been described in conjunction with FIGS. 20 to 22.

As further entered in dashed lines in FIG. 23, the or at least one of the provided magnet systems with available cooling means 27, in particular cooling plate, can be disposed at the backside of the cooling means.

Figure 26:
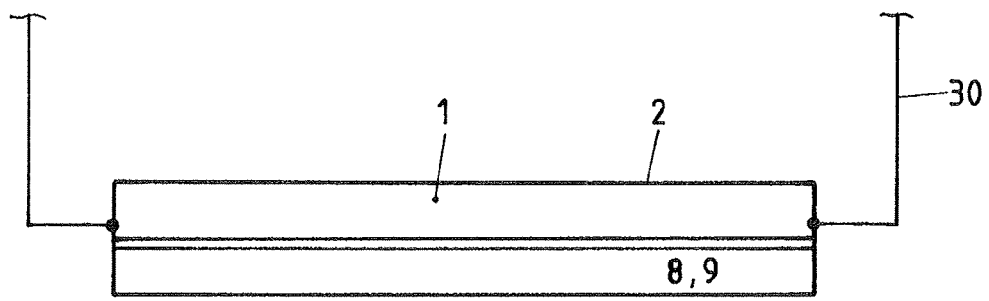

For reasons of application flexibility, it can be extremely desirable to have access to the or to the at least one provided magnet system without impairing the vacuum atmosphere, wherein the arc source according to the invention is operated. Therewith it is also possible to implement the magnet system, inventive per se, for the arc source as a changeover magnet system and to readily exchange it with respect to a vacuum receptacle from the outside without impairing the vacuum. This is fundamentally achieved according to FIG. 26 thereby that the magnet system configuration 8, 9 according to the invention is separated in terms of vacuum at least from the target front face 2, which in operation is located within the schematically indicated vacuum receptacle 30.

Figure 27:
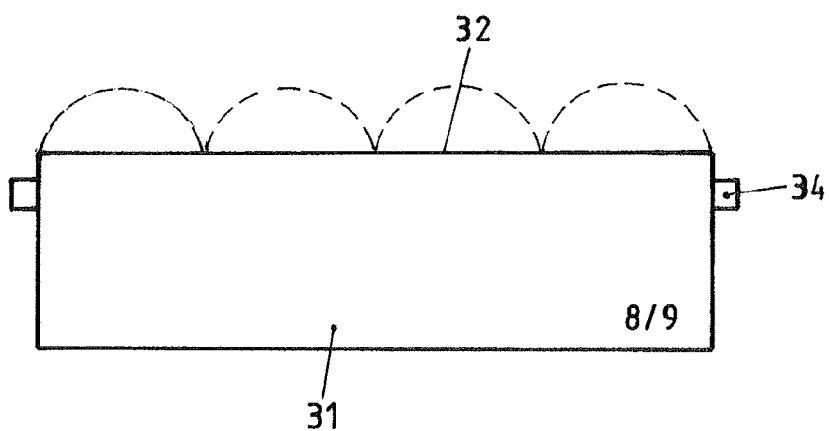

A magnet system configuration according to the invention is shown schematically in an embodiment in FIG. 27. In addition to an optional cooling means (not shown), it comprises in a housing 31 the magnet systems 8, 9 provided according to the invention. The housing 31 with the magnet system configuration defines an exit face 32 for the magnetic field, shown in dashed lines, which is coupled to the target of the arc source according to the invention, such as by means of schematically shown quick release fastener 34. Such a magnet system configuration, in particular one developed as a changeover magnet configuration, can, as stated, also incorporate a provided cooling means or it can be flanged onto a cooling means on the vacuum receptacle side.

In conjunction with different examples the advantageous action of an arc source according to the invention will be shown in the following.

The trials were carried out on an RCS coating unit by Balzers with octagonal cross section and a coating volume of approximately 1000 L. The diameter of the coating chamber is 1070 mm, the height 830 mm. As the arc source a standard arc source by Balzers with a target diameter of approximately 160 mm, d=6-12 mm, target material: Ti or TiAl) was utilized and tested at different operating parameters with a conventional and a magnet system configuration according to the invention. The conventional magnet system has a structure according to FIG. 1 with two axially poled permanent magnet rings, while the magnet system according to the invention was implemented corresponding to FIG. 4. It was found that with the magnet system according to the invention, in addition to the improvement of quality of the coated surfaces, also a significant improvement of the target utilization is achieved. Depending on the operating parameters, the utilization of the target material with known magnet system was between 15 and 25 percent, that attained with the source according to the invention between 30 and 70 percent.

The operating parameters and limit values within which the particular arc sources were tested, are compiled in Table 1.

TABLE 1

| Parameter | Unit | Preferred Range | Lower, Upper Limit |
| --- | --- | --- | --- |
| Pressure | mbar | $10^{-4} - 4 \times 10^{-1}$ | $10^{-4} - 10^{-1}$ |
| Arc current | A | 150-210 | 40-250 |
| Arc voltage | V | 25-35 | 10-100 |

TABLE 1-continued

| Parameter | Unit | Preferred Range | Lower, Upper Limit |
|---|---|---|---|
| Vaporization rate Ti | g/min | appr. 0.1-0.3 | to appr. 0.4 |
| Substrate distance | mm | 200-300 | 100-550 |

Table 2 lists by example additionally two operating modes for the deposition of TiN or TiAlN, where to the substrates a bias voltage was applied.

TABLE 2

| | Bias [V] | Ar [sccm] | N2 [sccm] | p [mbar] |
|---|---|---|---|---|
| TiN | 100 | 400 | 800 | 3.8 10−2 |
| TiAlN | 40-150 | 400 | 800 | 3.8 10−2 |

The invention claimed is:

1. An arc source with a target (1), comprising:
a target front face (2) for vacuum-arc-evaporating target material;
a target backside;
a central target region (Z);
a target margin region (A) defining a periphery of the target (1);
a magnet system consisting of an inner magnet system (8) in a region of said central target region (Z) and an outer magnet system (9) in the target margin region (A), for providing a magnetic field in a region of said target front face (2), the outer magnet system (9) being outside the periphery of the target (1);
an additional magnet configuration comprising a coil looped around a center of said target (1), wherein an outer periphery of the outer magnet system (9) shares an outer periphery of the coil;
wherein said inner magnet system (8) is separate from said outer magnet system (9) and wherein said inner magnet system (8) is arranged at or behind said target backside and consists of dipoles ($D_8$) provided by magnets;
wherein said outer magnet system (9) is arranged at or behind said target backside;
wherein said coil is arranged at or behind said target backside;
wherein each of said dipoles ($D_8$), which are provided by said magnets of said inner magnet system (8), are orientated at least substantially parallel to said target front face (2);
wherein at said target front face (2) components of said magnetic field parallel ($B_r$) to said target front face (2) are larger than components of said magnetic field perpendicular ($B_z$) to said target front face (2) in a region of a surface area (R') of at least 80% of said target front face (2);
wherein said dipoles ($D_8$) and said magnets are provided by said inner magnet system (8),
further comprising a cover in said central target region (Z) electrically insulated from said target (1) and along said target front face (2), and
wherein said cover masks said central target region (Z) at least up to a first locus along said target front face (2) at which said components of the magnetic field parallel ($B_r$) to said target front face (2) are equal to said components of the magnetic field perpendicular ($B_z$) to said target front face (2) when progressing from said central target region (Z) of the target (1) towards the target margin region (A).

2. The arc source of claim 1, wherein the components of the magnetic field parallel ($B_r$) to said target front face (2) are larger than the components of said magnetic field perpendicular ($B_z$) to said target front face (2) in the region of a surface area (R') of at least 90% of said target front face (2).

3. The arc source of claim 1, wherein said components of the magnetic field parallel ($B_r$) to said target front face (2) in said surface area (R') are 20-60 Gauss.

4. The arc source of claim 1, wherein said components of the magnetic field parallel ($B_r$) to said target front face (2) are 40-50 Gauss.

5. The arc source of claim 1, wherein said cover is of at least one of: a magnetically soft material; a high-temperature resistant magnetic alloy; and an electrically insulating material.

6. The arc source of claim 1, wherein said cover is in contact with said target front face (2).

7. The arc source of claim 1, wherein said cover is countersunk into said target front face (2).

8. The arc source of claim 7, wherein said cover is countersunk into said target front face (2) by 0.5 mm to 6 mm.

9. The arc source of claim 1, wherein at least a part of said magnets is counter-sunk into said target backside.

10. The arc source of claim 1, further comprising a cooling plate along said target backside, at least a part of said magnets being counter-sunk into said cooling plate.

* * * * *